(12) United States Patent
Lyakh

(10) Patent No.: US 11,901,703 B2
(45) Date of Patent: Feb. 13, 2024

(54) QCL WITH BRANCH STRUCTURE AND RELATED METHODS

(71) Applicant: UNIVERSITY OF CENTRAL FLORIDA RESEARCH FOUNDATION, INC., Orlando, FL (US)

(72) Inventor: Arkadiy Lyakh, Oviedo, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 292 days.

(21) Appl. No.: 17/304,881

(22) Filed: Jun. 28, 2021

(65) Prior Publication Data

US 2021/0399527 A1    Dec. 23, 2021

Related U.S. Application Data

(63) Continuation of application No. 17/304,269, filed on Jun. 17, 2021.

(60) Provisional application No. 63/040,212, filed on Jun. 17, 2020.

(51) Int. Cl.
*H01S 5/34* (2006.01)
*H01S 5/10* (2021.01)
*H01S 5/22* (2006.01)

(52) U.S. Cl.
CPC .......... *H01S 5/3402* (2013.01); *H01S 5/1007* (2013.01); *H01S 5/1014* (2013.01); *H01S 5/1082* (2013.01); *H01S 5/22* (2013.01)

(58) Field of Classification Search
CPC .... H01S 5/3401; H01S 5/3402; H01S 5/3418; H01S 5/3419; H01S 5/1007; H01S 5/1003; H01S 5/1014; H01S 5/101
See application file for complete search history.

(56) References Cited

U.S. PATENT DOCUMENTS

| | | |
|---|---|---|
| 9,917,418 B2 | 3/2018 | Razeghi |
| 10,177,535 B1 | 1/2019 | Lyakh |
| 10,790,637 B2 | 9/2020 | Lyakh |
| 10,811,847 B2 | 10/2020 | Lyakh et al. |

FOREIGN PATENT DOCUMENTS

DE    112006001938 T5 *   5/2008   ............. B82Y 20/00

OTHER PUBLICATIONS

Zhou et al. ("High performance monolithic, broadly tunable mid-infrared quantum cascade lasers"), vol. 4, No. 10, Oct. 2017 Optica, pp. 1228-1231. (Year: 2017).*
Bismuto et al. ("Large cavity quantum cascade lasers with InP interstacks") Applied Physics Letters 93, 2008, pp. 231104-01 through 231104-3 (Year: 2008).*

(Continued)

*Primary Examiner* — Tod T Van Roy
*Assistant Examiner* — Delma R Fordé
(74) *Attorney, Agent, or Firm* — Allen, Dyer, Doppelt + Gilchrist, PA

(57) ABSTRACT

A QCL may include a substrate, and a semiconductor layer adjacent the substrate. The semiconductor layer may define branch active regions, and a stem region coupled to output ends of the branch active regions. Each branch active region may have a number of stages less than 30.

20 Claims, 6 Drawing Sheets

(56) References Cited

OTHER PUBLICATIONS

Hoffmann et al. "Tree array quantum cascade laser" Optics Express: vol. 17, No. 2; Jan. 19, 2009; pp. 9.
Lyakh et al. "Continuous wave operation of buried heterostructure 4.6μm quantum cascade laser Y-junctions and tree arrays" Optics Express 1203: vol. 22, No. 1; Jan. 13, 2014: pp. 6.
Zhou et al. "Monolithically, widely tunable quantum cascade lasers based on a heterogeneous active region design" Scientific Reports | 6:25213 | DOI: 10.1038/srep25213: pp. 7.
Zolfaghari et al. "Additive manufacturing of precision optics at mricor and nanoscale" International Journal of Extreme Manufacturing; Int. J. Extrem. Manuf. 1 (2019) pp. 18.
Liu et al. "A mini-staged multi-stacked quantum cascade laser for improved optical and thermal performance" Semicond. Sci. Technol. 24 (2009) 075023 (5pp).

* cited by examiner

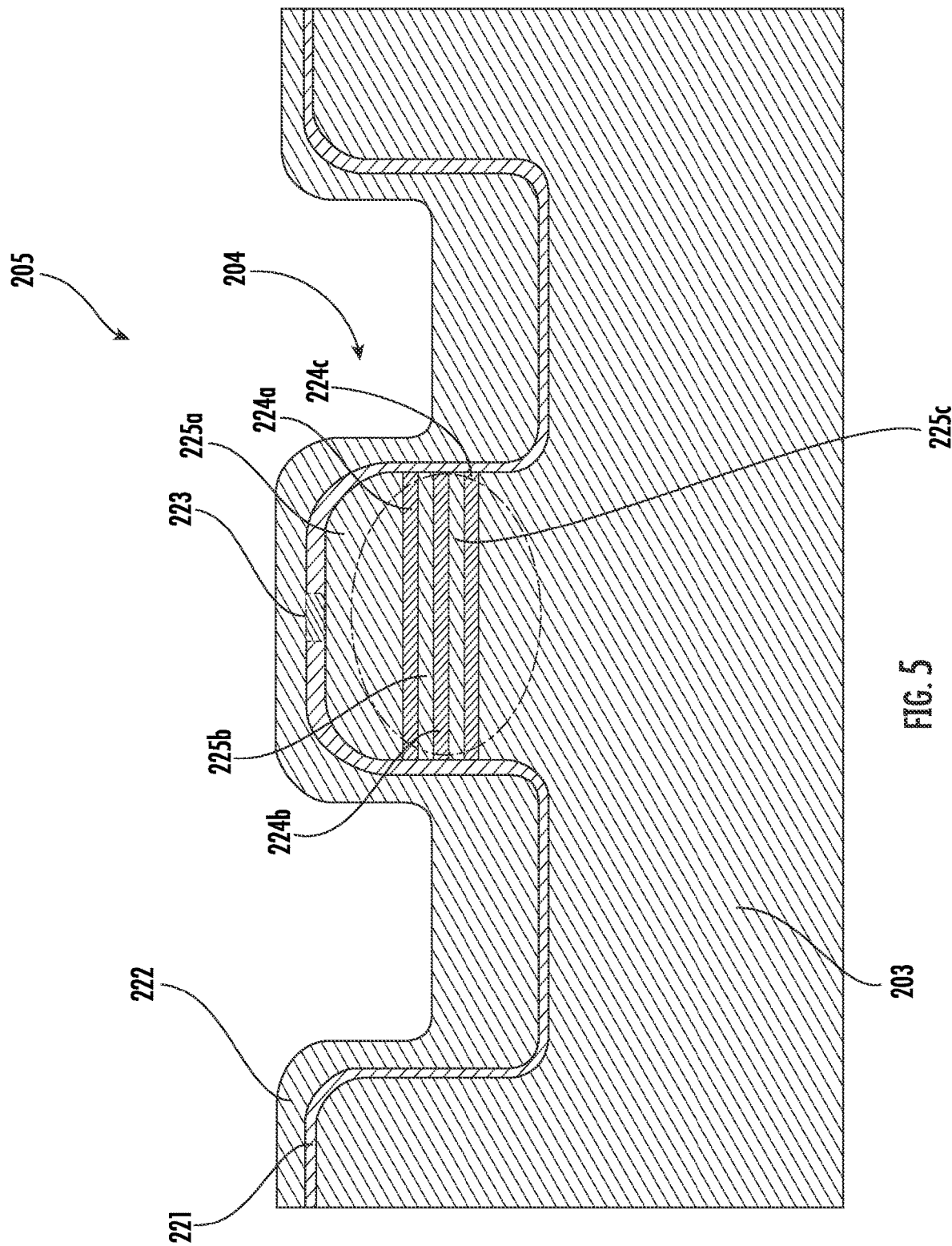

QCL WITH BRANCH STRUCTURE AND RELATED METHODS

RELATED APPLICATION

This application is a continuation of U.S. application Ser. No. 17/304,269 filed on Jun. 17, 2021, which claims priority to U.S. Application No. 63/040,212 filed Jun. 17, 2020, the entire subject matter of which is incorporated herein by reference in its entirety.

TECHNICAL FIELD

The present disclosure relates to lasers and, in particular, to a quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these approaches, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

SUMMARY

Generally, a QCL may include a substrate, and a semiconductor layer adjacent the substrate and defining a plurality of branch active regions, and a stem region coupled to output ends of the plurality of branch active regions. Each branch active region may have a number of stages less than 30.

In particular, each branch active region may have a ridge width greater than 10 µm. The substrate may include a back facet adjacent the stem region, and a front facet opposite the back facet. The stem region may include a tapered end at the back facet. Each of the plurality of branch active regions may comprise a tapered end at the front facet. The back facet may be configured to emit a continuous wave output of 50 watts. The back facet may be configured to emit greater than 90% of an output power within a central far-field lobe. Each branch active region may include a buried-heterostructure (BH). Each branch active region may include a ridge-waveguide (RWG) structure.

Another aspect is directed to a tree array QCL laser device. The tree array QCL laser device may comprise a substrate comprising a back facet, and a front facet opposite the back facet, and a semiconductor layer adjacent the substrate. The semiconductor layer may define a plurality of branch active regions, and a stem region adjacent the back facet and coupled to output ends of the plurality of branch active regions. Each branch active region may have a number of stages less than 30 and a ridge width greater than 10 m.

Yet another aspect is directed to a method for making a QCL. The QCL may include forming a semiconductor layer adjacent a substrate and defining a plurality of branch active regions, and a stem region coupled to output ends of the plurality of branch active regions. Each branch active region may have having a number of stages less than 30.

Another aspect is directed to a QCL comprising a substrate, and a semiconductor layer adjacent the substrate. The semiconductor layer may define a plurality of branch active regions, and a stem region coupled to output ends of the plurality of branch active regions. Each branch active region may include a plurality of laser cores, and a plurality of spacer layers between the plurality of laser cores. The plurality of laser cores may have a number of stages less than 50.

Another aspect is directed to a method for making a QCL comprising forming a semiconductor layer adjacent a substrate. The semiconductor layer may define a plurality of branch active regions, and a stem region coupled to output ends of the plurality of branch active regions. Each branch active region may comprise a plurality of laser cores, and a plurality of spacer layers between the plurality of laser cores. The plurality of laser cores may have a number of stages less than 50.

BRIEF DESCRIPTION OF THE DRAWINGS

FIG. 5 is a schematic cross-sectional view of a laser core from a second embodiment of the QCL, along line 5-5 of FIG. 2.

DETAILED DESCRIPTION

Figure 1:
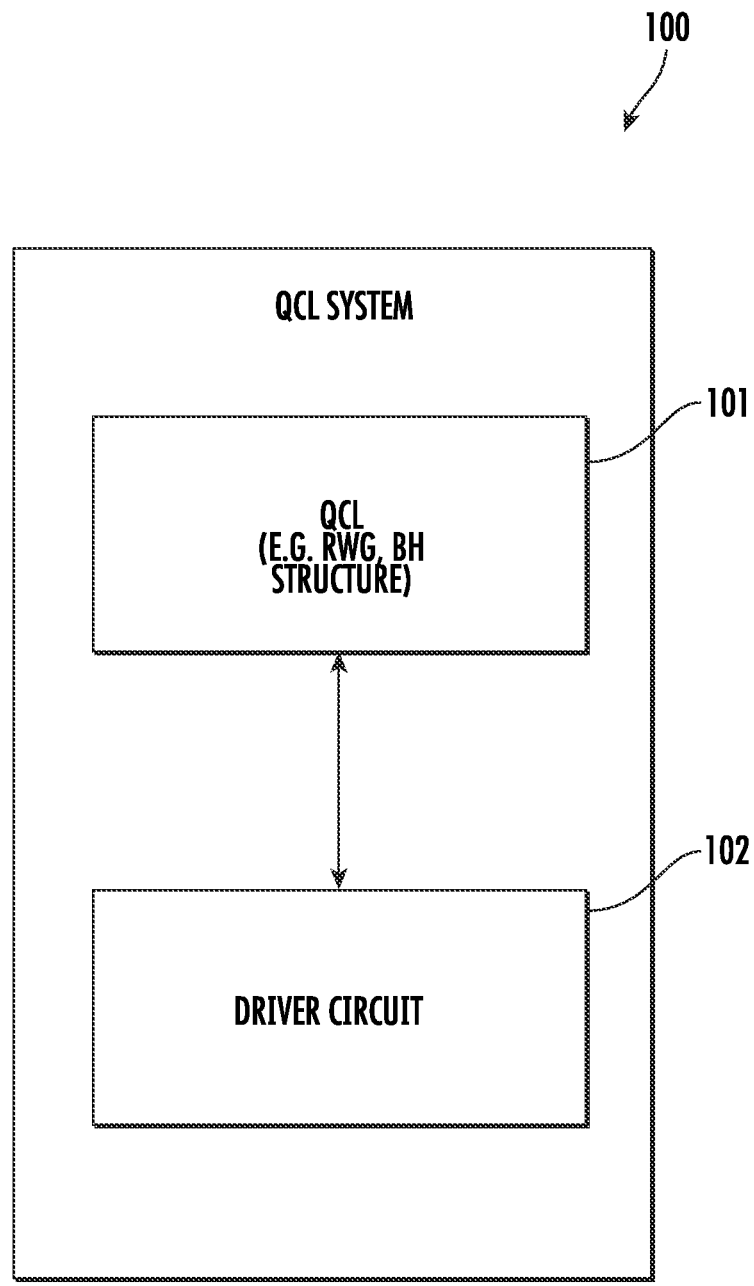
FIG. 1 is a schematic diagram of a first example embodiment of a QCL system, according to the present disclosure.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

The present disclosure discloses a beam combining configuration for QCLs capable of producing multi-watt continuous wave (CW) optical power with a high beam quality. CW QCL tree arrays have been explored before. For example, in-phase operation with on-axis far-field maximum was demonstrated for a BH QCL Y-junction, and CW output power of 1.5 W was demonstrated for a 4-element tree array [1]. This configuration has been essentially abandoned due to a complex fabrication process: to achieve in-phase operation, each element of the array, as well as the stem, have to be single-moded waveguides. This implies ridge width of approximately 5 μm for traditional 40-stage 4.6 μm BH QCLs. Unfortunately, narrow ridge BH QCLs have generally low yield as the hard mask used for the BH overgrowth (on top of the narrow ridges) does not have enough physical support and therefore often collapses during wafer processing. As a consequence, yield for traditional tree-array QCLs is very low, incompatible with practical applications. Moreover, in the typical approach disclosed in [1], the broad-area configuration had not been explored as it was believed that such devices would not run in CW and would have a poor beam quality.

Figure 2A:
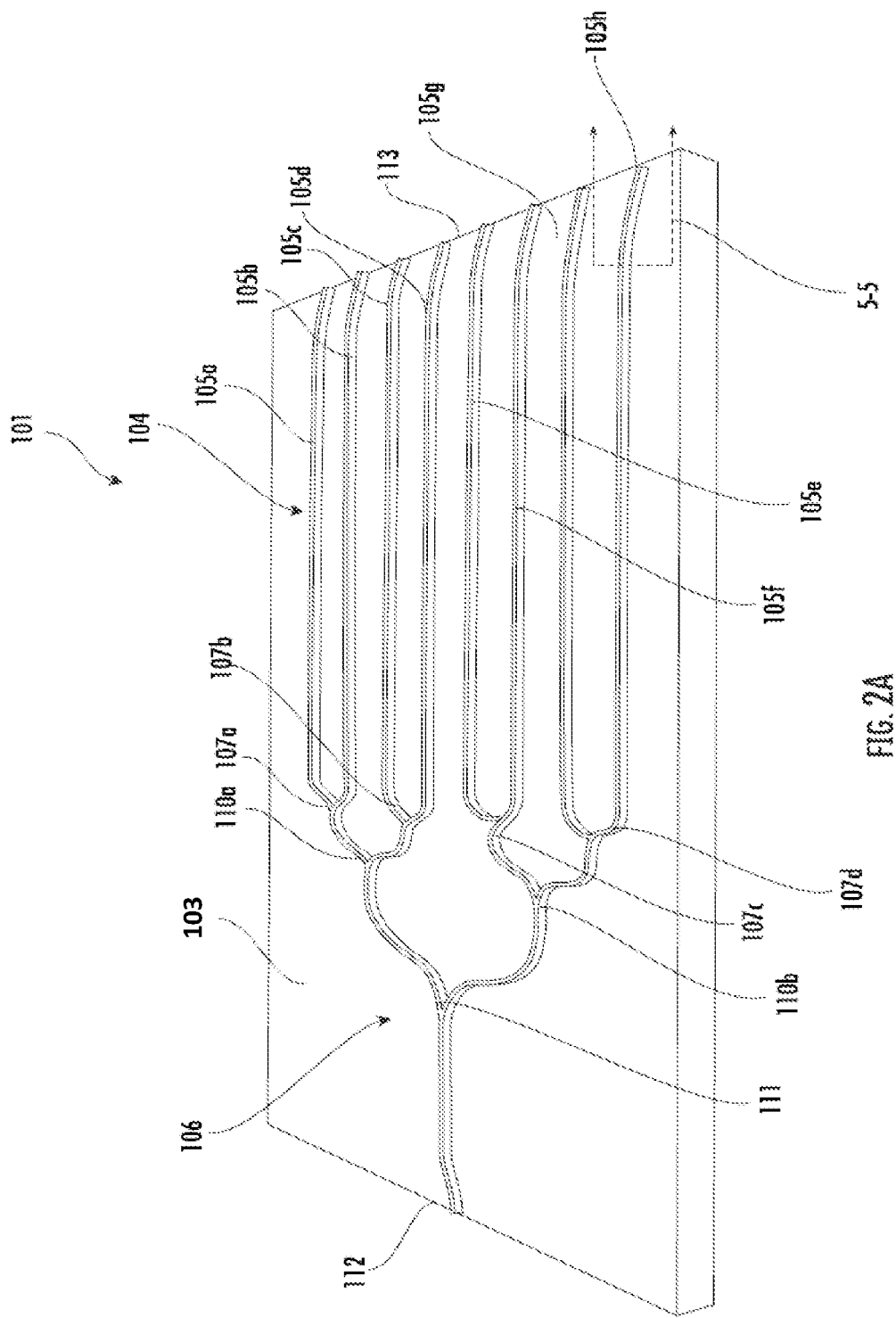
FIG. 2A is a schematic perspective view of a first embodiment of a QCL, according to the present disclosure.
Figure 3:
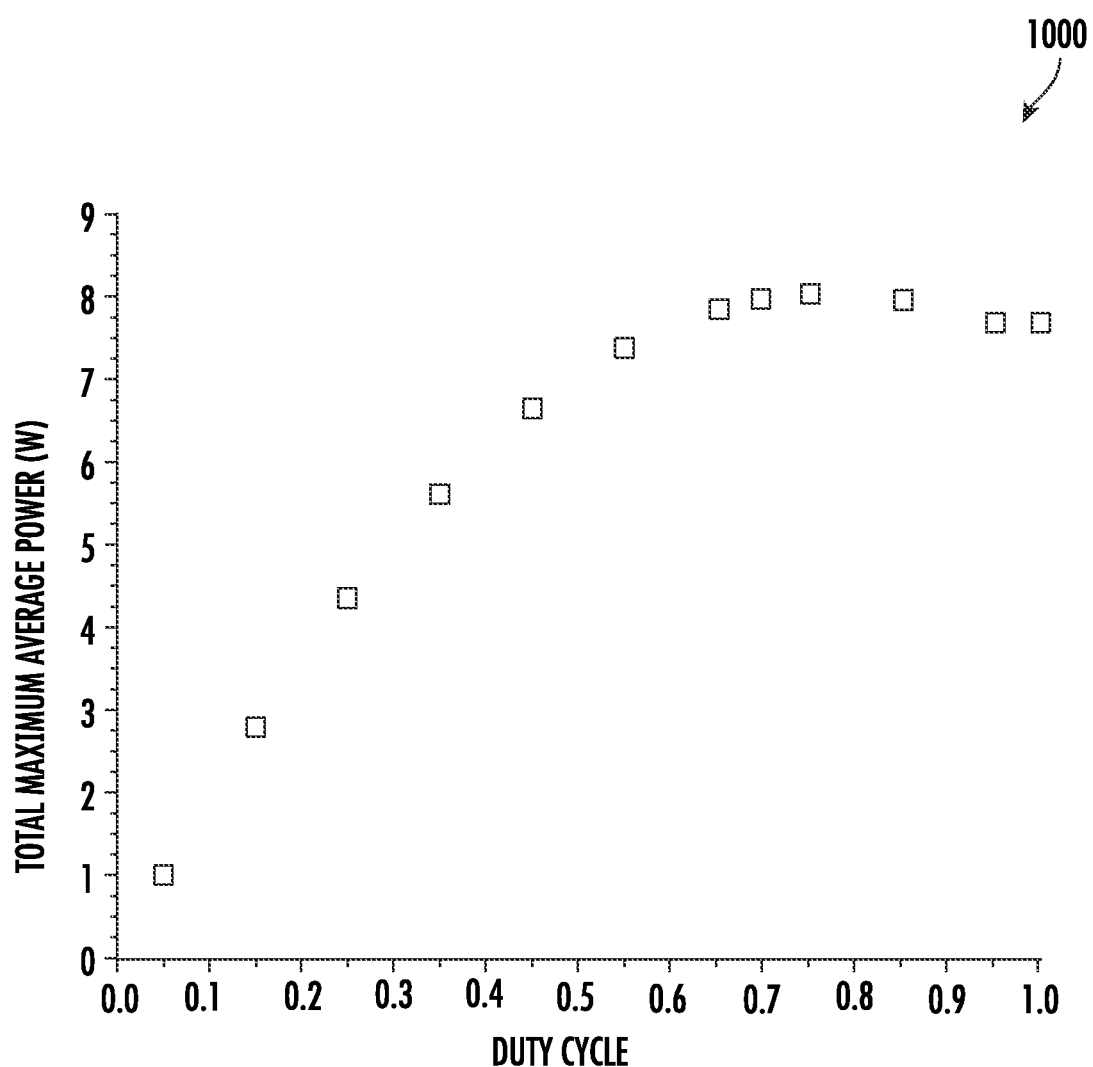
FIG. 3 is a diagram of power over duty cycle in the single-stack broad-area QCL.

Single-stack broad-area QCLs (single emitters) can deliver up to 8 W of CW power (FIG. 2A) in a high quality beam when active region width and thickness are carefully balanced to ensure fundamental mode dominance. This makes QCL structures optimized for broad-area configuration ideal for the tree arrays. Indeed, 15-stage 4.6 μm QCLs operate on fundamental lateral mode for ridge width of up to 20 μm, which largely solves the fabrication issue as broad-area devices can have >90% yield. In tree-arrays, a fraction of optical power in the central far-field lobe can exceed 90% for devices with a large fill-factor at the output facet (the ratio of element width to interelement spacing). A large fill-factor can be achieved employing tapers in the vicinity of the output facet, as shown in FIG. 2A. At the same time, fundamental mode dominance ensures in-phase operation with an on-axis far-field maximum. Finally, each branch can deliver 5 W to 10 W of CW power as shown in FIG. 3, depending on its length, making the goal of 50 W from a single 16-element array realistic.

A closer analysis of mode competition in broad-area QCLs shows that a low mode overlap with the laser core favors fundamental mode operation. As discussed above, for single-stack devices, this implies that a low number of stages should be used to achieve a nearly Gaussian beam quality. However, a low mode overlap factor with the laser core can also be achieved for traditional number of stages (up to 50) utilizing InP spacers. This would further increase output power as laser slope efficiency is directly proportional to number of stages.

To summarize, the disclosed QCL tree array configuration with broad-area emitters potentially offers ultra-high brightness with on-axis far-field maximum and most power concentrated in the central lobe. In-phase operation for the branches (fundamental mode of operation) can be achieved either employing less than 30 stages (FIGS. 1-4) for single-stack devices or employing InP spacers (FIG. 5) for multi-stack devices.

A tree array QCL configuration includes two or more emitters; and where each emitter is (ridge waveguide or BH) a broad-area single-stack emitter with <30 stages and ridge width>10 μm. A tree array QCL configuration includes two or more emitters, and where each emitter is (ridge waveguide or BH) a broad-area multi-stack emitter with ridge width>10 μm.

Figure 2B:
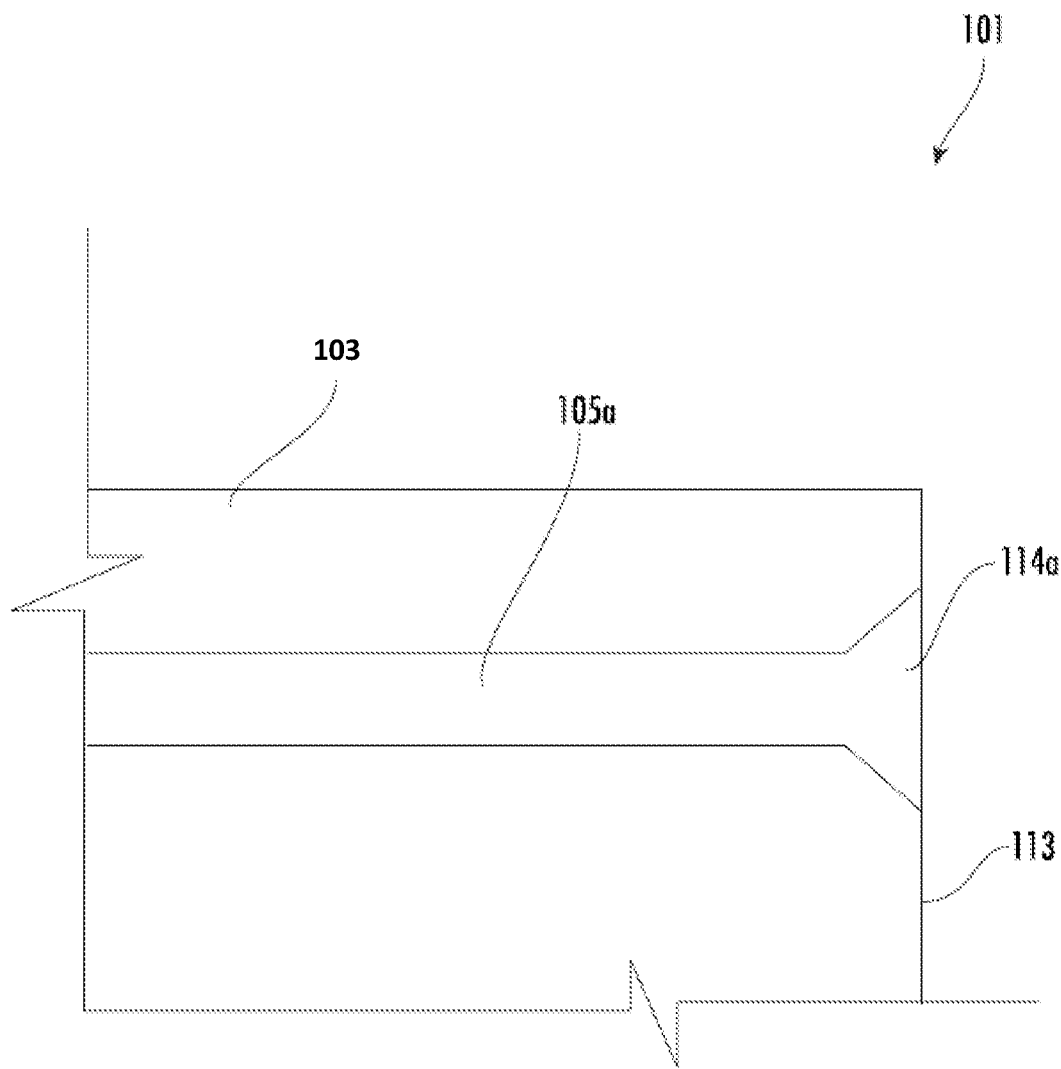
FIG. 2B is a schematic top plan view of a portion of the QCL from FIG. 2A.

Referring to FIGS. 1 and 2A-2B, a QCL system 100 according to the present disclosure is now described. The QCL system 100 illustratively includes a QCL 101, and a driver circuit 102 coupled to the QCL. The QCL 101 illustratively includes a substrate 103, and a semiconductor layer 104 adjacent the substrate. The semiconductor layer 104 defines a plurality of branch active regions 105a-105h, and a stem region 106 coupled to output ends of the plurality of branch active regions. Each branch active region 105a-105h has a number of stages less than 30.

The plurality of branch active regions 105a-105h includes respective pairs of branch active regions 105a-105b, 105c-105d, 105e-105f, 105g-105h. Each pair of branch active regions 105a-105b, 105c-105d, 105e-105f, 105g-105h terminates in a respective Y-junction 107a-107d. In the illustrated embodiment, the stem region 106 includes three levels of Y-junctions 107a-107d, 110a-110b, 111 to sequentially combine the output of each of the plurality of branch active regions 105a-105h. Of course, more or less Y-junctions can be used with varying numbers of the pairs of branch active regions.

In some embodiments, each branch active region 105a-105h may have a ridge width greater than 10 μm. In some embodiments, each branch active region 105a-105h may comprise one of a BH structure or a RWG structure. In prior typical approaches to the tree array structures with thinner ridge width (e.g. [1]), the yield rate was undesirably low. In particular, during the fabrication process, the mask layer would be formed on top of the thin ridge, and subsequently, the supporting layer underneath would be partially etched away. In this situation, a portion of mask layer extends laterally away from the ridge without underneath support. In these approaches, the mask layer would collapse, rendering the device defective, potentially reducing yield. Because of this, tree array structures may not be practical for some applications.

More specifically, the substrate 103 illustratively includes a back facet 112 adjacent the stem region 106, and a front facet 113 opposite the back facet. Also, each of the plurality of branch active regions 105a-105h terminates at the front facet 113 with a tapered end 114a. The stem region 106 includes a tapered end at the back facet 112. The stem region 106 also terminates at the back facet 112. The tapered ends 114a concentrate power in the central lobe of the laser output (i.e. on-axis power and suppressing higher order modes of operation).

In some embodiments, the back facet 112 is configured to emit a continuous wave output of 50 watts. Here, the opposing front facet 113 would be coated with high reflectivity coating. In other embodiments, the front facet 113 is configured to emit a continuous wave output of 50 watts. Here, the opposing back facet 112 would be coated with high reflectivity coating. As will be appreciated by those skilled in the art, it may be problematic to collect power from the back facet 112 as high power can damage the back facet and it may be preferential to distribute the same power over several facets at the front facet 112.

Also, the plurality of branch active regions 105a-105h is substantially parallel (i.e. ±°5 of parallel) with one another, and substantially perpendicular (i.e. ±°5 of °90) to the front facet 113. The stem region 106 is also substantially perpendicular with the back facet 112, and substantially parallel with the plurality of branch active regions 105a-105h.

Another aspect is directed to a method for making a QCL 101 comprising forming a semiconductor layer 104 adjacent a substrate 103. The semiconductor layer 104 defines a plurality of branch active regions 105a-105h, and a stem region 106 coupled to output ends of the plurality of branch active regions. Each branch active region 105a-105h has a number of stages less than 30 in a single stack or can have larger number of stages in the multi-stack.

Figure 4:
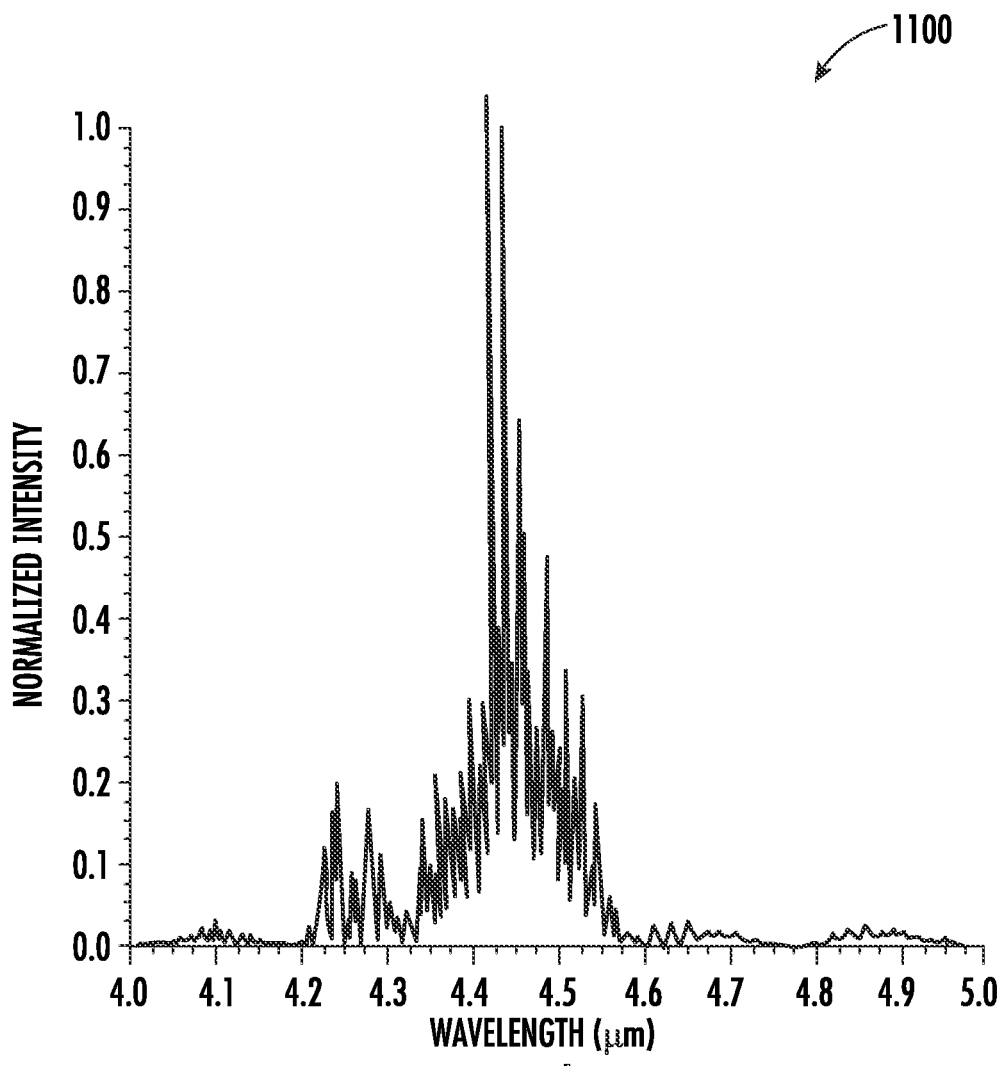
FIG. 4 is a diagram of normalized intensity over frequency in the single-stack broad-area QCL.

Referring now additionally to FIGS. 3-4, a diagram 1000 shows total maximum power over duty cycle for an example single-stack, broad-area emitter with dimensions of 10 mm×20 μm. Diagram 1100 shows intensity over frequency for the single-stack, broad-area emitter. As illustrated, the average maximum power peaks at over 8 watts with peak intensity at a wavelength of 4.45 μm (i.e. Middle Wavelength Infrared (MWIR)) and with a pulse width 10 μm.

Referring now additionally to FIG. 5, another embodiment of the branch active region 205 is now described. In this embodiment of the branch active region 205, those elements already discussed above with respect to FIGS. 1-4 are incremented by 100 and most require no further discussion herein. This embodiment differs from the previous embodiment in that this branch active region 205 illustratively includes a semiconductor layer 204 define a plurality of branch active regions 205, and a stem region coupled to output ends of the plurality of branch active regions. Each branch active region 205 illustratively includes a plurality of laser cores 224a-224c, and a plurality of spacer layers 225a-225c respectively interweaved between the plurality of laser cores.

In the embodiments of FIGS. 1-4, the broad area thin configuration was used to meet thermal conduction requirements. Since lateral thermal conductivity is more difficult, the broad area configuration with reduced stages permits vertical heat conduction.

More specifically, the substrate 203 and the plurality of spacer layers 225a-225c each comprises indium phosphide, for example, but other suitable dielectrics can be used. This embodiment is able to provide cumulatively across the plurality of laser cores 224a-224c more stages than the prior embodiments due to the thermal mitigation effect of the plurality of spacer layers 225a-225c.

In this embodiment, the plurality of laser cores 224a-224c has a number of stages less than 50. This is enabled by the spacing and thermal conductivity of the plurality of spacer layers 225a-225c.

The branch active region 205 also illustratively includes a dielectric layer 221 over the substrate 203, the plurality of laser cores, and the plurality of spacer layers. The plurality of spacer layers extends laterally to the dielectric layer 221. The dielectric layer 221 may comprise an oxide based dielectric, for example. The branch active region 205 also includes an electrically conductive cover layer 222 over the dielectric layer 221. The electrically conductive cover layer 222 may comprise gold, or silver, for example. The dielectric layer 221 defines an opening above the uppermost spacer layer 225a, and the electrically conductive cover layer 222 fills into the opening to define an upper conductive contact 223.

Another aspect is directed to a method for making a QCL comprising forming a semiconductor layer 204 adjacent a substrate 203. The semiconductor layer 204 defines a plurality of branch active regions 205, and a stem region coupled to output ends of the plurality of branch active regions. Each branch active region 205 comprises a plurality of laser cores 224a-224c, and a plurality of spacer layers 225a-225c between the plurality of laser cores. The plurality of laser cores 224a-224c has a number of stages less than 50.

A quantum cascade laser (QCL) comprising: a substrate; and a semiconductor layer adjacent the substrate and defining a plurality of branch active regions, and a stem region coupled to output ends of the plurality of branch active regions; each branch active region comprising a plurality of laser cores, and a plurality of spacer layers between the plurality of laser cores, the plurality of laser cores having a number of stages less than 50. The QCL of claim 1 wherein each branch active region has a ridge width greater than 10 μm. The QCL of claim 1 wherein the substrate includes a back facet adjacent the stem region, and a front facet opposite the back facet. The QCL of claim 3 wherein the stem region comprises a tapered end at the back facet. The QCL of claim 3 wherein each of the plurality of branch active regions comprises a tapered end at the front facet. The QCL of claim 3 wherein the back facet is configured to emit a continuous wave output of 50 watts. The QCL of claim 3 wherein the back facet is configured to emit greater than 90% of an output power within a central far-field lobe. The QCL of claim 1 wherein each branch active region comprises a buried-heterostructure (BH). The QCL of claim 1 wherein each branch active region comprises a ridge-waveguide (RWG) structure.

A tree array quantum cascade laser (QCL) laser device comprising: a substrate comprising a back facet, and a front facet opposite the back facet; and a semiconductor layer adjacent the substrate and defining a plurality of branch active regions, and a stem region adjacent the back facet and coupled to output ends of the plurality of branch active regions; each branch active region comprising a plurality of laser cores, and a plurality of spacer layers between the plurality of laser cores, the plurality of laser cores having a number of stages less than 50; each branch active region having a ridge width greater than 10 μm.

The tree array QCL of claim 10 wherein the stem region comprises a tapered end at the back facet. The tree array QCL of claim 10 wherein each of the plurality of branch active regions comprises a tapered end at the front facet. The tree array QCL of claim 10 wherein the back facet is configured to emit a continuous wave output of 50 watts. The tree array QCL of claim 10 wherein the back facet is configured to emit greater than 90% of an output power within a central far-field lobe. The tree array QCL of claim 10 wherein each branch active region comprises a buried-heterostructure (BH). The tree array QCL of claim 10 wherein each branch active region comprises a ridge-waveguide (RWG) structure.

A method for making a quantum cascade laser (QCL) comprising: forming a semiconductor layer adjacent a substrate and defining a plurality of branch active regions, and a stem region coupled to output ends of the plurality of branch active regions; each branch active region comprising a plurality of laser cores, and a plurality of spacer layers between the plurality of laser cores, the plurality of laser cores having a number of stages less than 50. The method of claim 17 wherein each branch active region has a ridge width greater than 10 μm. The method of claim 17 wherein the substrate includes a back facet adjacent the stem region, and a front facet opposite the back facet. The method of claim 19 wherein the stem region comprises a tapered end at the back facet.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

REFERENCES (THE CONTENTS ARE WHICH ARE HEREBY INCORPORATED BY REFERENCE IN THEIR ENTIRETY)

[1] A. Lyakh, R. Maulini, A. Tsekoun, R. Go, and C. K. N. Patel, "Continuous wave operation of buried heterostructure 4.6 μm quantum cascade laser Y-junctions and tree arrays", Optics Express 22, 1203, January 2014

[2] Bismuto, A., et al., Large cavity quantum cascade lasers with InP interstacks. Applied Physics Letters, 2008. 93(23): p. 231104.
[3] Liu, J., et al., A mini-staged multi-stacked quantum cascade laser for improved optical and thermal performance. Vol. 24. 2009. 075023.

The invention claimed is:

1. A quantum cascade laser (QCL) comprising:
 a substrate; and
 a semiconductor layer adjacent the substrate and defining
  a plurality of branch active regions, and
  a stem region coupled to output ends of the plurality of branch active regions;
 each branch active region comprising
  a plurality of laser cores, and
  a plurality of spacer layers respectively interweaved between the plurality of laser cores,
  a dielectric layer over the plurality of laser cores, and the plurality of spacer layers, the plurality of spacer layers extending laterally to the dielectric layer,
  the plurality of laser cores having a number of stages less than 50.

2. The QCL of claim 1 wherein each branch active region has a ridge width greater than 10 μm.

3. The QCL of claim 1 wherein the substrate includes a back facet adjacent the stem region, and a front facet opposite the back facet.

4. The QCL of claim 3 wherein the stem region comprises a tapered end at the back facet.

5. The QCL of claim 3 wherein each of the plurality of branch active regions comprises a tapered end at the front facet.

6. The QCL of claim 3 wherein the back facet is configured to emit a continuous wave output of 50 watts.

7. The QCL of claim 3 wherein the back facet is configured to emit greater than 90% of an output power within a central far-field lobe.

8. The QCL of claim 1 wherein each branch active region comprises a buried-heterostructure (BH).

9. The QCL of claim 1 wherein each branch active region comprises a ridge-waveguide (RWG) structure.

10. A tree array quantum cascade laser (QCL) laser device comprising:
 a substrate comprising a back facet, and a front facet opposite the back facet; and
 a semiconductor layer adjacent the substrate and defining
  a plurality of branch active regions, and
  a stem region adjacent the back facet and coupled to output ends of the plurality of branch active regions;
 each branch active region comprising
  a plurality of laser cores, and
  a plurality of spacer layers respectively interweaved between the plurality of laser cores,
  a dielectric layer over the plurality of laser cores, and the plurality of spacer layers, the plurality of spacer layers extending laterally to the dielectric layer,
  the plurality of laser cores having a number of stages less than 50;
 each branch active region having a ridge width greater than 10 μm.

11. The tree array QCL of claim 10 wherein the stem region comprises a tapered end at the back facet.

12. The tree array QCL of claim 10 wherein each of the plurality of branch active regions comprises a tapered end at the front facet.

13. The tree array QCL of claim 10 wherein the back facet is configured to emit a continuous wave output of 50 watts.

14. The tree array QCL of claim 10 wherein the back facet is configured to emit greater than 90% of an output power within a central far-field lobe.

15. The tree array QCL of claim 10 wherein each branch active region comprises a buried-heterostructure (BH).

16. The tree array QCL of claim 10 wherein each branch active region comprises a ridge-waveguide (RWG) structure.

17. A method for making a quantum cascade laser (QCL) comprising:
 forming a semiconductor layer adjacent a substrate and defining
  a plurality of branch active regions, and
  a stem region coupled to output ends of the plurality of branch active regions;
 each branch active region comprising
  a plurality of laser cores, and
  a plurality of spacer layers respectively interweaved between the plurality of laser cores,
  a dielectric layer over the plurality of laser cores, and the plurality of spacer layers, the plurality of spacer layers extending laterally to the dielectric layer,
  the plurality of laser cores having a number of stages less than 50.

18. The method of claim 17 wherein each branch active region has a ridge width greater than 10 μm.

19. The method of claim 17 wherein the substrate includes a back facet adjacent the stem region, and a front facet opposite the back facet.

20. The method of claim 19 wherein the stem region comprises a tapered end at the back facet.

* * * * *